US008610100B2

(12) United States Patent
Hiralal et al.

(10) Patent No.: US 8,610,100 B2
(45) Date of Patent: Dec. 17, 2013

(54) APPARATUS COMPRISING NANOWIRES

(75) Inventors: Pritesh Hiralal, Cambridge (GB); Alan Colli, Cambridge (GB)

(73) Assignee: Nokia Corporation, Espoo (FI)

(*) Notice: Subject to any disclaimer, the term of this patent is extended or adjusted under 35 U.S.C. 154(b) by 777 days.

(21) Appl. No.: 12/459,339

(22) Filed: Jun. 30, 2009

(65) Prior Publication Data

US 2010/0330409 A1 Dec. 30, 2010

(51) Int. Cl.
*H01L 47/00* (2006.01)
(52) U.S. Cl.
USPC .................................................. 257/4
(58) Field of Classification Search
USPC .............. 257/4, E33.062, E29.111, E21.017; 438/578, 666; 977/762; 429/209
See application file for complete search history.

(56) References Cited

U.S. PATENT DOCUMENTS

| | | | | |
|---|---|---|---|---|
| 5,501,893 | A | 3/1996 | Laermer et al. | 428/161 |
| 2006/0022575 | A1 | 2/2006 | Ryu et al. | 313/495 |
| 2007/0109837 | A1* | 5/2007 | Kurt et al. | 365/156 |
| 2009/0214956 | A1* | 8/2009 | Prieto et al. | 429/310 |
| 2010/0065819 | A1* | 3/2010 | Wu | 257/21 |
| 2010/0202952 | A1* | 8/2010 | Zhang et al. | 423/325 |
| 2010/0253369 | A1* | 10/2010 | Izadnegahdar | 324/664 |
| 2011/0024169 | A1* | 2/2011 | Buchine et al. | 174/258 |

FOREIGN PATENT DOCUMENTS

| | | |
|---|---|---|
| CN | 1728321 A | 2/2006 |
| CN | 101117208 A | 2/2008 |
| CN | 101266919 A | 9/2008 |

OTHER PUBLICATIONS

Peng et al. ("Silicon Nanowires for Rechargeable Lithium-Ion Battery Anodes" Appl. Phys. Lett., 93, 033105 (2008).*
Green et al. ("Structured Silicon Anodes for Lithium Battery Applications", Electrochem. and Solid-State Lett. 6 (5) A75-A79 (2003).*
Peng et al. ("Ordered silicon nanowire arrays via nanosphere lithography and metal-induced etching", Appl. Phys. Lett. 90, 163123 (2007)).*
Huang, et al, "Fabrication of Silicon Nanowire Arrays with Controlled Diameter,Length, and Density", vol. 19, No. 5, (Mar. 5, 2007), (pp. 744-748).
Guangli Che et al., "Carbon Nanotubule Membranes for Electrochemical Energy Storage and Production", Nature, vol. 393, pp. 346-349, (May 28, 1998).
Ki Tae Nam et al., "Virus-Enabled Synthesis and Assembly of Nanowires for Lithium Ion Battery Electrodes", Science, vol. 312, pp. 885-888, (May 12, 2006).
Kuthanapillil Shaju et al., "Mesoporous and Nanowire $Co_3O_4$ as Negative Electrodes for Rechargeable Lithium Batteries", Physical Chemistry Chemical Physics, vol. 9, pp. 1837-1842, (2007).

(Continued)

*Primary Examiner* — Yu-Hsi D Sun
(74) *Attorney, Agent, or Firm* — Harrington & Smith

(57) ABSTRACT

A method including: a) depositing a masking material over a substrate comprising silicon; b) removing the masking material using a first process that removes the masking material in preference to silicon; c) removing silicon using a second process that removes silicon in preference to the masking material; d) continuously repeating the sequence of steps a), b) and c) to control the creation of nanowires; and e) stopping repetition of the sequence of steps a), b) and c).

12 Claims, 3 Drawing Sheets

(56) References Cited

OTHER PUBLICATIONS

Min-Sik Park et al., "Preparation and Electrochemical Properties of $SnO_2$ Nanowires for Application in Lithium-Ion Batteries", Angew Chem. Int. Ed., vol. 46, pp. 750-753, (2007).

Graham Armstrong et al., "TiO2(B) Nanowires as an Improved Anode Material for Lithium-Ion Batteries Containing $LiFePO_4$ or $LiNi_{0.5}Mn_{1.5}O_4$ Cathodes and a Polymer Electrolyte", Adv. Mater., vol. 18, pp. 2597-2600, (2006).

B. A. Boukamp et al., "All-Solid Lithium Electrodes with Mixed-Conductor Matrix", J. Electrochem. Soc.: Electrochemical Science and Technology, vol. 128, No. 4, pp. 725-729, (Apr. 1981).

Takahisa Shodai et al., "Study of Li3-xMxN (M:Co, Ni or Cu) System for Use as Anode Material in Lithium Rechargeable Cells", Solid State Ionics 86-88, pp. 785-789, (1996).

P. Poizot et al., "Nano-Sized Transition-Metal Oxides as Negative-Electrode Materials for Lithium-Ion Batteries", Nature, vol. 407, pp. 496-499, (Sep. 28, 2000).

Uday Kasavajjula et al., "Nano-And Bulk-Silicon-Based Insertion Anodes for Lithium-Ion Secondary Cells", Journal of Power Sources, vol. 163, pp. 1003-1039, (2007).

Bo Gao et al., "Alloy Formation in Nanostructured Silicon", Adv. Mater., vol. 13, No. 11, pp. 816-819, (Jun. 5, 2001).

C. K. Chan et al., "High-Performance Lithium Battery Anodes Using Silicon Nanowires", Nature Nanotechnology, vol. 3, pp. 31-35, (Jan. 2008).

K Peng et al., "Silicon Nanowires for Rechargeable Lithium-Ion Battery Anodes", Applied Physics Letters, vol. 93, 033105, (2008).

R.S. Wagner et al., "Vapor-Liquid-Solid Mechanism of Single Crystal Growth", Applied Physics Letters, vol. 4, No. 5, pp. 89-90, (Mar. 1, 1964).

Alfredo Morales et al., "A Laser Ablation Method for the Synthesis of Crystalline Semiconductor Nanowires", Science, vol. 279, pp. 208-211, (Jan. 9, 1998).

Svetoslav Koynov et al., "Black Multi-Crystalline Silicon Solar Cells", Phys. Stat. Sol. (RRL) 1, No. 2, pp. R53-R55 (2007).

Masakazu Kanechika et al., "Control of Shape of Silicon Needles Fabricated by Highly Selective Anisotropic Dry Etching", J. Vac. Sci. Technol. B 20(4), pp. 1298-1302, (Jul./Aug. 2002).

J. Kim et al., "Nanostructured Surfaces for Dramatic Reduction of Flow Resistance in Droplet-Based Microfluidics", IEEE Conference MEMS (Las Vegas) pp. 479-482, (2002).

Chang-Hwan Choi et al., "Fabrication of a Dense Array of Tall Nanostructures Over a Large Sample Area With Sidewall Profile and Tip Sharpness Control", Nanotechnology 17, pp. 5326-5333, (2006).

Jia Zhu et al., "Optical Absorption Enhancement in Amorphous Silicon Nanowire and Nanocone Arrays", Nano Letters, vol. 9, No. 1, pp. 279-282, (2009).

C.H. Crouch et al., "Comparison of Structure and Properties of Femtosecond and Nanosecond Laser-Structured Silicon", Applied Physics Letters, vol. 84, No. 11, pp. 1850-1852, (Mar. 15, 2004).

M. Stubenrauch et al., "Black Silicon—New Functionalities in Microsystems", Journal of Micromechanics and Microengineering, vol. 16, pp. S82-S87, (2006).

\* cited by examiner

APPARATUS COMPRISING NANOWIRES

FIELD OF THE INVENTION

Embodiments of the present invention relate to a method and an apparatus. In particular, they relate to a method for creating silicon nanowires.

BACKGROUND TO THE INVENTION

Nanowires are wires with very small diameters. The diameter of a nanowire is typically of the order of a nanometer. The length of a nanowire may vary but is usually at least tens or hundreds of nanometers in length. Nanowires may be formed from a material such as silicon.

Silicon nanowires provide one dimensional electronic pathways which enable efficient charge transport. This makes silicon nanowires useful for a number of different applications where efficient charge transport is needed. For example, silicon nanowires may be used as an electrical contact in a battery.

It is useful to be able to create nanowires using a simple and inexpensive method.

BRIEF DESCRIPTION OF VARIOUS EMBODIMENTS OF THE INVENTION

According to various, but not necessarily all, embodiments of the invention there is provided a method comprising: a) depositing a masking material over a substrate comprising silicon; b) removing the masking material using a first process that removes the masking material in preference to silicon and is configured to partially remove masking material; c) removing silicon using a second process that removes silicon in preference to the masking material; d) repeating the sequence of steps a), b) and c) until repetition of the sequence of steps a), b) and c) is stopped, wherein the repetition of the sequence of steps a), b) and c) creates nanowires.

According to various, but not necessarily all, embodiments of the invention there is provided an apparatus comprising: a metallic layer a silicon substrate comprising recessed nanowires; and an electrolyte contacting the recessed nanowires and the metallic layer.

The apparatus may be for storing electrical energy. For example, the apparatus may be a battery.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

Figure 1:
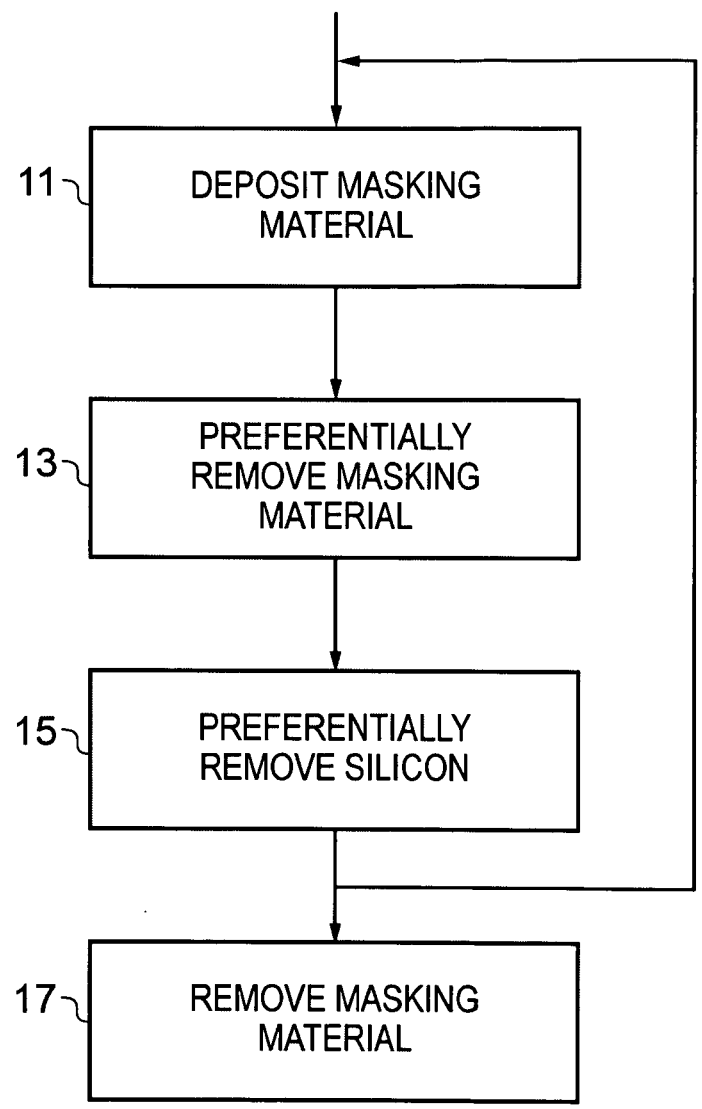
FIG. 1 is a block diagram illustrating a method according to embodiments of the invention.

The Figures illustrate a method comprising:
a) depositing 11 a masking material 25 over a substrate 21 comprising silicon;
b) removing 13 the masking material 25 using a first process that removes the masking material in preference to silicon and is configured to partially remove masking material;
c) removing 15 silicon from the substrate 21 using a second process that removes silicon in preference to the masking material 25;
d) repeating the sequence of steps a), b) and c) until repetition of the sequence of steps a), b) and c) is stopped, wherein the repetition of the sequence of steps a), b) and c) creates nanowires The steps a), b) and c) may be short duration processes (of the order 1 second) and the sequence of steps a), b) and c) may be repeated N times to create nanowires 35 where M1<N<M2 and where M2>M1 and M1 is any natural number in the range 2 to 10000 and M2 is any natural number in the range 3 to 10001.

FIG. 1 is a block diagram illustrating a method according to some embodiments of the invention. The method may be used to create nanowires 35 on a surface of a silicon substrate 21. A [100] wafer of silicon may be used as the substrate 21. The silicon substrate 21 may be heavily doped.

At block 11 a masking material 25 is deposited over a substrate 21 comprising silicon.

The masking material 25 may be created using a passivating gas. The passivating gas may comprise any gas which forms a layer of material that subsequently protects the underlying substrate 21 from etching.

In some embodiments of the invention the masking layer 25 may comprise a polymer. For example the passivating gas may comprise $C_4F_8$ which forms a masking layer 25 comprising polytetrafluoroethylene (PTFE).

At block 13 the masking material 25 is removed using a first process that removes the masking material 25 in preference to silicon.

The first process may use any suitable process. The first process may, for example, be a chemical etching process. The first process may, for example, use oxygen plasma.

At block 15 silicon is removed from the substrate 21 using a second process that removes silicon in preference to the masking material 25.

The second process may use a chemical etchant. The second process may, for example, use $SF_6$.

After block 15, the process returns to block 11 and the cycle of blocks 11, 13, 15 repeats. At block 11 masking material 25 is deposited over the substrate 21 comprising silicon. The substrate may now have, in addition to silicon, remnants of masking material from the first cycle of blocks 11, 13, 15. Next at block 13 the masking material 25 is removed using the first process that removes the masking material 25 in preference to silicon. Then at block 15 silicon is removed from the substrate 21 using a second process that removes silicon in preference to the masking material 25. Then the cycle of blocks 11, 13, 15 repeats again.

The sequence of blocks 11, 13, 15 is continuously repeated until the repetition is stopped. The number of repetitions may be used to control the lengths of nanowires 35 formed by the method. As an example, the nanowires may be a few nanometres in diameter and hundreds of nanometres in length.

After stopping the continuous repetition of the sequence of blocks 11, 13, 15, the method may move to block 17. At block 17, remaining masking material 25 may be removed. This may be achieved by applying the first process for a longer duration. The first process removes the masking material 25 in preference to silicon.

In some embodiments of the invention the duration of the first process at block 13 may be controlled. The first process preferentially removes masking material over silicon.

Increasing the duration of the first process reduces the number of nanowires formed e.g. it increases the average separation between the randomly distributed nanowires 35. Increasing the separation between the nanowires 35 changes the optical properties, particularly the light scattering properties, of the collection of nanowires. As the average separation changes the color of light reflected from the collection of nanowires may changes.

It is postulated that increasing the duration of the first process, reduces the 'survival rate' of effective remnants 27 of masking material 25. It is postulated that these effective remnants 27 can mask the silicon 21 (that eventually forms the nanowires 35) from etching during the second process (block 15).

In some embodiments of the invention the method may be carried out in an inductively coupled plasma (ICP) system. In such embodiments the silicon substrate 21 is positioned within a chamber of the ICP system. Helium gas may be provided to cool the silicon substrate 21 while the method is being carried out. The coil which provides the plasma may be connected to a 13.56 MHz radio frequency power supply. The passivating gas used may comprise $C_4F_8$. The flow rate of the $C_4F_8$ may be 200 sccm (standard cubic centimeters per minute). The first process may use oxygen plasma. The flow rate of the oxygen plasma may be 100 sccm. The second process may use $SF_6$. The flow rate of the $SF_6$ may be 250 sccm. The pressure may be kept at around $5\times10^{-2}$ mbar. The main inductor power used may be 600 W and the substrate power may be 50 W. The duration of the passivation (block 11) may be fixed at 1.5 s and the duration of the second etching process (block 15) may be fixed at 0.8 s. The duration of the first process (block 13) may be varied between 0.5 and 1.5 s. The variation in the duration of the first process has been found to enable the density of the silicon nanowires 35 to be varied as described above.

It may be possible to vary this process and achieve satisfactory results. The three key parameters are those that control the deposition of masking material, those that affect the first process that preferentially removes masking material and those that affect the second process that preferentially removes silicon.

The deposition of the masking material 25 may be achieved using a passivating gas. One example is $C_4F_8$. The flow rate of the $C_4F_8$ may be fixed between 100 and 300 sccm (standard cubic centimeters per minute) but a preferred value is 200 sccm. The duration of this step may be fixed between 1 and 3 seconds but a preferred duration is 1.5 s.

The first process may use oxygen plasma. The flow rate of the oxygen plasma may be fixed between 50 and 150 sccm but a preferred value is 100 sccm. The duration of this step may be varied between 0.5 and 2.0 seconds to control the separation of nanowires.

The second process may use $SF_6$. The flow rate of the $SF_6$ may be fixed between 100 and 400 sccm but a preferred value is 250 sccm. The duration of this step may be fixed between 0.5 and 1.5 seconds but a preferred duration is 0.8 s.

The ratios of the preferred deposition rates for the masking material (200 sccm), the etchant for the first process (100 sccm) and the etchant for the second process (250 sccn) is 4:2:5 which is approximately 2:1:2.

The ratios of the preferred process times for the masking material deposition (1.5 s), the first process (0.5 to 1.5 s) and the second process (0.8 s) vary between 15:5:8 and 15:15:8.

The duration of the first process may be less than the duration of the masking material deposition.

The duration of the first process may be less than the duration of the second process.

The duration of the first process may be greater than the duration of the second process.

FIGS. 2A to 2E schematically illustrate how the substrate 21 may develop according to a current and, as yet, unproven hypothesis during the method described with reference to FIG. 1.

Figure 2A:
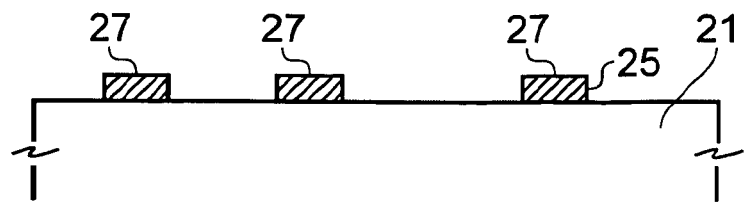
FIGS. 2A to 2E schematically illustrate the creation of nanowires.

It is currently believed that as a consequence of blocks 11 and 13, remnants 27 of masking material 25 are initially left on a surface 23 of the silicon substrate 21. This is schematically illustrated in FIG. 2A.

The amount of masking material 25 deposited at block 11 and the length of the first process at block 13 may be controlled, so that the randomly distributed remnants 27 of masking material 25 have on average the desired separation.

Figure 2B:
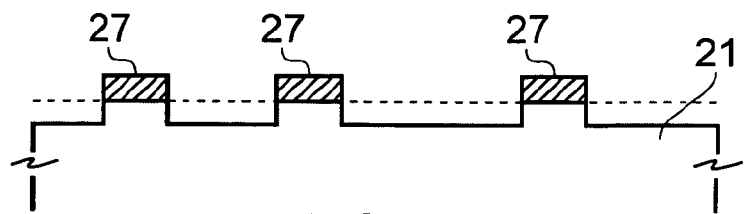
Figure 2C:
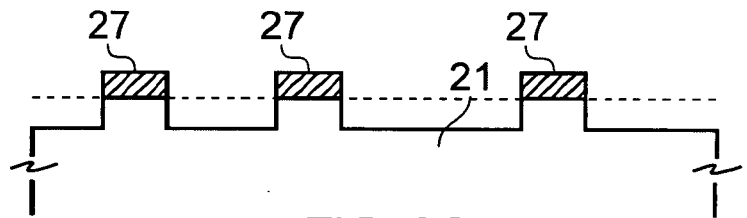
Figure 2D:
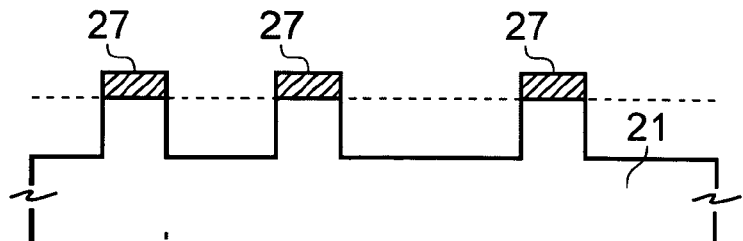

The second process at block 15 may remove some of the remnant material but it predominantly removes silicon (FIG. 2B). Keeping the duration of the second process short may prevent the remnants 27 being wholly removed by the second process. Keeping the duration of the second process short may prevent the silicon substrate 21 underlying the remnants being undermined if the second process is not entirely anisotropic.

It is currently believed that as a consequence of the repetition of blocks 11 and 13, some remnants 27 of masking material are retained on the silicon substrate 21. The second process at block 15 predominantly removes silicon where it is exposed between the remnants 27 of masking material. Silicon that lies underneath the remnants 27 is not removed starting the formation of nanowires 35. This is schematically illustrated in FIG. 2B.

Figure 2E:
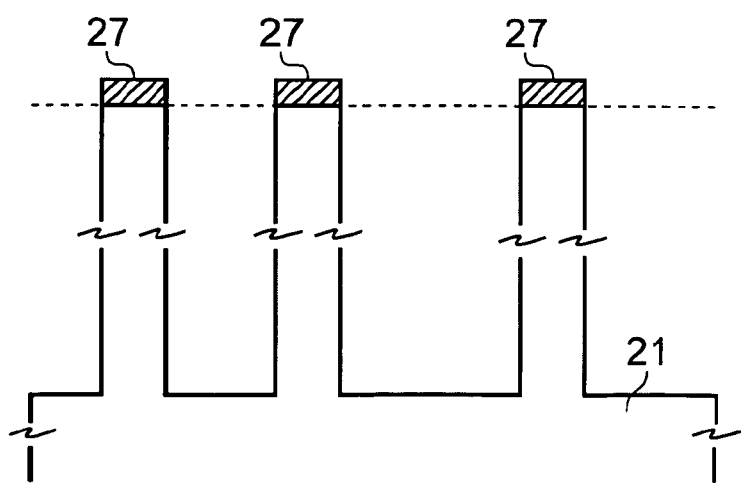

With continual repetition of the cycle of blocks 11, 13, 15, it is believed that the remnants 27 are retained on the average where they were originally formed (FIG. 2C) and the repeated removal of silicon from elsewhere (FIG. 2D) eventually forms the nanowires (FIG. 2E). The nanowires 35 it is believed are created under the remnants 27 of masking material, growing a little with each cycle.

Embodiments of the invention provide the advantage that they provide a simple method of creating silicon nanowires 35. The method may be carried out at room temperature which makes the method easier and reduces the cost.

Embodiments of the invention also provide the advantage that they may be carried out on any surface of a silicon substrate 21. This makes the method useful for creating apparatus comprising silicon nanowires 35 because the nanowires may be created within the apparatus.

FIGS. 3A to 3E schematically illustrate a method of creating an apparatus comprising silicon nanowires according to an embodiment of the invention. In the illustrated embodiment the apparatus is a battery. It is to be appreciated that in other embodiments of the invention other types of apparatus may be created.

Figure 3A:
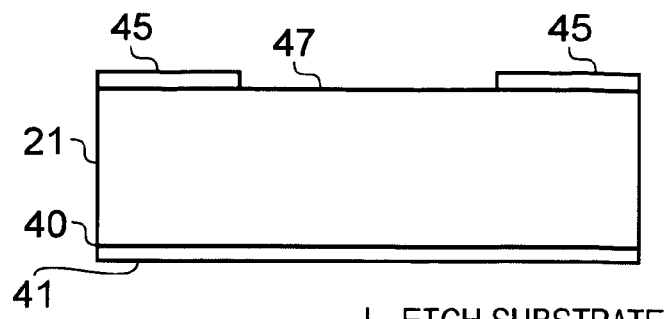
FIGS. 3A to 3E schematically illustrate a method of creating an apparatus comprising silicon nanowires according to an embodiment of the invention.

In FIG. 3A a silicon substrate 21 is provided. The size of the silicon substrate may be determined by the size of the battery that is to be created.

A metal layer 41 is provided on the lower surface 42 of the silicon substrate 21. The metal may be for example aluminum (Al), chromium (Cr), titanium (Ti), gold (Au) or nickel (Ni).

A layer 45 of $SiO_2$ is provided on the upper surface of the silicon substrate 21. The silicon substrate may be a [100] wafer. The $SiO_2$ layer 45 protects the portions of the silicon substrate 21 which are covered by the $SiO_2$ layer 45 from the etching processes which are carried out.

A gap is provided in the $SiO_2$ layer 45 by, for example, masked etching. The gap leaves a portion 47 of the silicon substrate 21 exposed so that an etching process may be carried out on the exposed portion 47 of the silicon substrate 21. The remaining SiO$_2$ layer 45 forms a mask for subsequent etching processes.

Figure 3B:
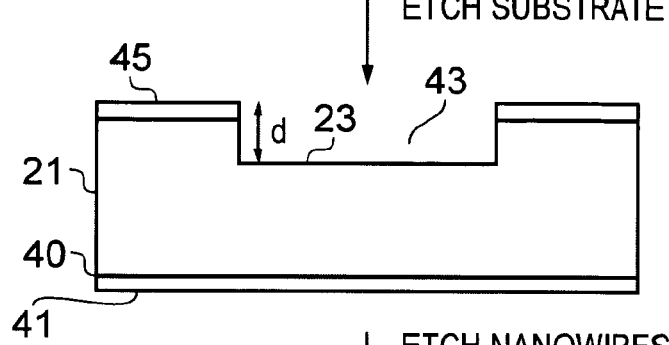

In FIG. 3B the exposed portion 47 of the silicon substrate 21 has been etched. The etching removes at least some of the silicon substrate 21 underlying the exposed portion 47 of the silicon substrate 21. As the portions of the silicon substrate 21 covered by the SiO$_2$ layer 45 are protected from the etching, the silicon substrate 21 underneath the SiO$_2$ layer 45 is not removed. Therefore the etching creates a recess 43 in the silicon substrate 21. The recess 43 has a depth d. The depth d may be of the order of 10 to 300 micrometers. The depth of the recess may be controlled by controlling the amount of time the etching is carried out for. In the illustrated example, the etching is anisotropic and the recess has substantially straight sidewalls in register with the edges of the SiO$_2$ mask 45.

Suitable processes for creating the SiO$_2$ mask 45 and etching the recess 43 are known from semiconductor engineering.

Figure 3C:
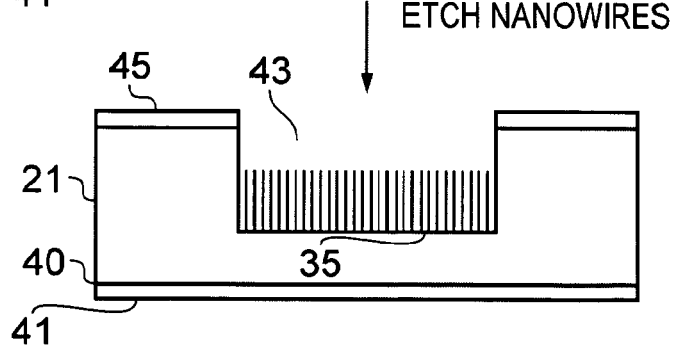

In FIG. 3C nanowires 35 have been created in the bottom of the recess 43. The nanowires 35 may be created using the methods described above in relation to FIG. 1. The separation of the nanowires may be controlled by varying the duration of the first process at block 13 which preferentially removes masking material 25.

As the nanowires have been formed downwards from a surface 23 at the bottom of the recess 43 they do not reach the top of the recess. This protects the nanowires 35 from mechanical damage.

Figure 3D:
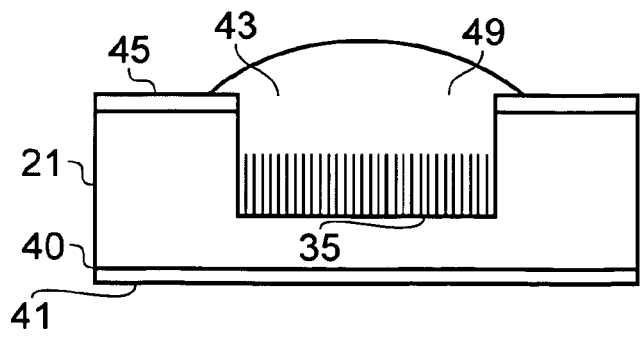

In FIG. 3D an electrolyte 49 has been added to the recess 43. In the embodiment illustrated in FIG. 3D the electrolyte 49 completely covers the nanowires 35 and fills the recess 43.

The electrolyte 49 may comprise any solution which enables electricity to be conducted. The electrolyte 49 may comprise a liquid or a gel. For example the electrolyte 49 may comprise 1M LiPF$_6$ in a 1:1 mixture of ethylene carbonate and diethyl carbonate.

Figure 3E:
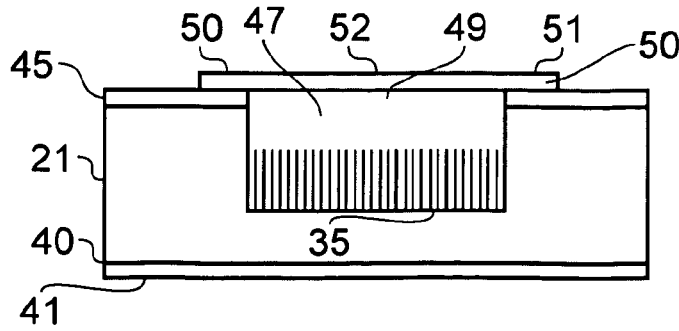

In FIG. 3E a further metal layer 51 is positioned in electrical contact with the electrolyte 49. In the embodiment illustrated in FIG. 3E the further metal layer 51 comprises edge portions 50 and a middle portion 52. The edge portions of the metal layer 51 are positioned overlaying portions of the SiO$_2$ layer 45. The SiO$_2$ layer 45 insulates the edge portions 50 of the metal layer 51 from the silicon substrate 21.

The middle portion 52 of the metal layer 51 extends over the recess 43 and is in electrical contact with the electrolyte 49 such that the electrolyte 49 enables the transport of electrical charge between the silicon nanowires 35 and the metal layer 51.

The metal layer 51 may comprise lithium. For example, the metal layer 51 may comprise LiFePO$_4$.

The metal layer 51 may completely cover the recess 43 so that the recess 43 is sealed. The metal layer 51 may prevent the electrolyte 49 from leaking out of the recess 43 during use.

The apparatus illustrated in FIG. 3E may be used as a battery. The silicon nanowires 35 act as an anode and the metal layer 51 acts as a cathode. The electrolyte 49 enables lithium ions to be transferred between the metal layer 51 and the silicon nanowires 35 when a potential difference is applied across the apparatus.

The transfer of the lithium ions to the silicon nanowires 35 causes the lithium ions to be absorbed by the nanowires 35. This decreases the separation between nanowires 35 which results in a change in the optical properties of the collection of nanowires. As the battery charges, the collection of nanowires may change color and the color of the collection of nanowires 35 may provide an indication of the amount of charge stored in the battery. In some embodiments of the invention a transparent portion may be provided to enable a user to view the collection of silicon nanowires 35. For example, a transparent portion may be provided in the metal layer 51.

Embodiments of the invention therefore provide a method of creating a self packaged battery. Embodiments of the invention may be used to create silicon nanowires 35 in situ in the bottom of the recess 43. The recess 43 may then be used as a cavity for storing electrolyte which is sealed by a cathode.

In some embodiments of the invention the silicon substrate 21 may comprise other apparatus such as circuits in addition to the battery created by the above method.

The illustration of a particular order to the blocks in the Figures does not necessarily imply that there is a required or preferred order for the blocks and the order and arrangement of the block may be varied. Furthermore, it may be possible for some steps to be omitted.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:
1. An apparatus comprising:
   recessed nanowires in a silicon substrate, wherein the tops of the nanowires are at a level below the top of the substrate;
   a metallic layer;
   an electrolyte in contact with the recessed nanowires and the metallic layer, wherein the metallic layer, the recessed nanowires, and the electrolyte are configured to form a self-packaged battery;
   wherein the recessed nanowires are formed by:
   a) depositing a masking material over a substrate comprising silicon;
   b) removing the masking material using a first process that removes the masking material in preference to silicon and is configured to partially remove masking material;
   c) removing silicon using a second process that removes silicon in preference to the masking material;
   d) repeating the sequence of steps a), b) and c) until repetition of the sequence of steps a), b) and c) is stopped;
   wherein the nanowires are fabricated by further etching a recess that has been etched into the silicon substrate, wherein the nanowires and the recess are etched with the same process, and wherein the process self packages the battery.
2. An apparatus as claimed in 1 wherein the apparatus comprises a battery.
3. An apparatus comprising:
   a metallic layer;

a silicon substrate comprising recessed nanowires, wherein the tops of the nanowires are at a level below the top of the substrate; and an electrolyte contacting the recessed nanowires and the metallic layer;

wherein the metallic layer, the recessed nanowires, and the electrolyte are configured to form a self-packaged battery.

4. An apparatus as claimed in 3 wherein the metallic layer covers a recess in which the nanowires are recessed and the silicon substrate lies between the metallic layer and a further metallic layer.

5. An apparatus as claimed in claim 3 wherein the metallic layer comprises lithium and electric charge is transferred between the metallic layer and the nanowires by movement of lithium ions.

6. An apparatus as claimed in claim 5 wherein a spacing between the nanowires is decreased when the lithium ions are transferred to the nanowires and the light reflected from the nanowires changes colour.

7. An apparatus according to claim 3, wherein the nanowires are fabricated by etching, with a chemical etchant, a silicon substrate that has been etched with a recess.

8. An apparatus according to claim 3, wherein the nanowires and the recess are etched with the same process.

9. An apparatus according to claim 3, wherein the nanowires are fabricated by etching, with a chemical etchant, a silicon substrate that has been etched with a recess, and wherein the nanowires and the recess are etched with the same process.

10. An apparatus according to claim 3, wherein the recess is of a controlled depth.

11. An apparatus according to claim 3, wherein the nanowires are separated by a controlled separation.

12. An apparatus according to claim 3, wherein the nanowires are free from silver contamination.

* * * * *